(12) United States Patent
Kamei

(10) Patent No.: US 7,544,974 B2
(45) Date of Patent: Jun. 9, 2009

(54) POSITIVE ELECTRODE FOR COMPOUND SEMICONDUCTOR LIGHT-EMITTING DEVICE

(75) Inventor: Koji Kamei, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 11/660,040

(22) PCT Filed: Aug. 23, 2005

(86) PCT No.: PCT/JP2005/015596

§ 371 (c)(1),
(2), (4) Date: Feb. 12, 2007

(87) PCT Pub. No.: WO2006/022399

PCT Pub. Date: Mar. 2, 2006

(65) Prior Publication Data

US 2007/0181907 A1    Aug. 9, 2007

Related U.S. Application Data

(60) Provisional application No. 60/605,502, filed on Aug. 31, 2004.

(30) Foreign Application Priority Data

Aug. 24, 2004   (JP)  ............................. 2004-244054

(51) Int. Cl.
    *H01L 33/00* (2006.01)
(52) U.S. Cl. .................. 257/99; 257/103; 257/E33.063

(58) Field of Classification Search ............. 257/99, 257/E33.063
See application file for complete search history.

(56) References Cited

U.S. PATENT DOCUMENTS

| 5,401,330 A * | 3/1995 | Saito et al. .................. 136/259 |
| 2003/0052328 A1 | 3/2003 | Uemura |
| 2003/0062534 A1* | 4/2003 | Hata et al. .................... 257/99 |
| 2003/0168664 A1 | 9/2003 | Hahn et al. |
| 2004/0104395 A1* | 6/2004 | Hagimoto et al. ............. 257/79 |
| 2005/0008883 A1* | 1/2005 | Takagi et al. ................ 428/469 |
| 2007/0057272 A1* | 3/2007 | Urashima .................... 257/99 |

FOREIGN PATENT DOCUMENTS

| JP | 11-191641 A | 7/1999 |
| JP | 2000-294837 A | 10/2000 |
| JP | 2002-237618 A | 8/2002 |
| JP | 2003-168823 A | 6/2003 |
| JP | 2003-534668 A | 11/2003 |
| JP | 2004-63732 A | 2/2004 |
| JP | 2004-193338 A | 7/2004 |

* cited by examiner

*Primary Examiner*—Tu-Tu V Ho
(74) *Attorney, Agent, or Firm*—Sughrue Mion, PLLC

(57) ABSTRACT

An object of the present invention is to provide a positive electrode, in which the silver is used, for a compound-semiconductor light-emitting device high in inverse voltage and excellent in stability and productivity.

The inventive positive electrode for a compound-semiconductor light-emitting device comprises a reflective layer of a silver alloy.

7 Claims, 1 Drawing Sheet

POSITIVE ELECTRODE FOR COMPOUND SEMICONDUCTOR LIGHT-EMITTING DEVICE

CROSS REFERENCE TO RELATED APPLICATION

This application is an application filed under 35 U.S.C. §111(a) claiming benefit, pursuant to 35 U.S.C. §119(e) (1), of the filing date of the Provisional Application No. 60/605,502 filed on Aug. 31, 2004, pursuant to 35 U.S.C. §111(b).

TECHNICAL FIELD

The present invention relates to a positive electrode for a compound-semiconductor light-emitting device, a light-emitting device and a lamp using such a positive electrode and, particularly, to a positive electrode excellent in electrical characteristics and stability, as well as to a compound-semiconductor light-emitting device provided therewith and the inventions relating thereto.

BACKGROUND ART

In recent years, a gallium nitride-based compound semiconductor represented by the formula $Al_xIn_yGa_{1-x-y}N$ ($0 \leq x<1$, $0 \leq y<1$, $x+y<1$) has attracted much attention as a material for a light-emitting diode (LED) emitting ultraviolet to blue light, or green light. Light emission at high intensity in the ultraviolet and blue region and in the green region, which was hitherto difficult, has been made possible by using a semiconductor made of these materials. Gallium nitride-based compound semiconductors are generally grown on a sapphire substrate. As this is an insulating substrate, unlike that for GaAs-based light-emitting devices, an electrode cannot be provided on rear surface of the substrate. Therefore, both negative and positive electrodes must be provided on the semiconductor grown as a crystal.

In particular, in the case of a semiconductor device using a gallium nitride-based compound semiconductor, as the sapphire substrate can transmit light at the wavelength of the emitted light, a flip-chip-type structure, in which the device is mounted with the electrode surface on the underside, and light is extracted from the side of the sapphire substrate, has attracted much attention.

FIG. 1 is a schematic view showing an example of general structure of light-emitting device of this type. Thus, a light-emitting device has a buffer layer 2, a n-type semiconductor layer 3, a light-emitting layer 4, and a p-type semiconductor layer 5 successively grown as crystal on a substrate 1, with a portion of the light-emitting layer 4 and the p-type semiconductor layer 5 removed by etching so as to expose the n-type semiconductor layer 3, and a positive electrode 10 is formed on the p-type semiconductor layer 5 and a negative electrode 20 is formed on the n-type semiconductor layer 3. Such a light-emitting device is mounted, for example, with the surface having electrode formed thereon facing a lead frame, and then is bonded. Light emitted from the light-emitting layer 4 is extracted from the side of the substrate 1. In order to extract light efficiently in this type of light-emitting device, a reflective metal is used as the positive electrode 10, and is provided so as to cover the major portion of the p-type semiconductor layer 5 to thereby cause the light from the light-emitting layer toward the positive electrode to be reflected by the positive electrode 10 and to be extracted from the side of the substrate 1.

Accordingly, it is necessary that material for the positive electrode has a low contact resistance with the p-type semiconductor layer and a high reflectance. Generally, it has been known that silver (Ag) has the highest reflectance. It has also been known, however, that Ag often causes electromigration to occur.

Electromigration is a phenomenon in which a material is ionized and diffuses in the presence of water. For example, if electric current is supplied, in an atmosphere wherein water exists, to the electrode in which Ag is used, a deposit mainly composed of Ag is formed. If the deposit generated from the positive electrode reaches a negative electrode or the deposit couples a p-type semiconductor layer with an n-type semiconductor layer, the inverse voltage lowers to deteriorate the characteristic of the light-emitting device with time. Accordingly, when Ag is used as a reflective positive electrode, it is necessary to restrict the electromigration of Ag so that the characteristic is stabilized.

Japanese Unexamined Patent Publication (Kokai) Nos. 11-186598 and 11-186599 propose means for using Ag as material of the positive electrode, wherein a silver layer is provided on a p-type nitride semiconductor layer and a stabilized layer is further provided on the silver layer. It is described that the stabilized layer serves to facilitate the mechanical and electrical characteristic of the silver layer. The Ag layer could be formed in a stable manner on the p-type nitride semiconductor layer by controlling a deposition rate of Ag layer and a temperature of a sapphire substrate during the deposition.

Also, in Japanese Unexamined Patent Publication (Kokai) No. 11-220171, there is a proposal in that a first metallic layer (Ag) connected to the p-type semiconductor layer is covered with a second metallic layer. It is described that no electromigration occurs since the second metallic layer covers the Ag layer.

The provision of the stabilized layer on the silver layer, however, results in such problems as the rise of production cost and/or complication of the production process.

DISCLOSURE OF INVENTION

An object of the present invention is to solve the above-mentioned problems when the silver is used as a material for a positive electrode, and provide a positive electrode for a compound-semiconductor light-emitting device high in inverse voltage and excellent in stability and productivity.

The present invention is as follows:

(1) A positive electrode, for a compound-semiconductor light-emitting device, which comprises a reflective layer of silver alloy.

(2) A positive electrode, for a compound-semiconductor light-emitting device according to (1) above, wherein the silver alloy contains at least one element selected from the group consisting of neodymium, palladium, copper and bismuth.

(3) A positive electrode, for a compound-semiconductor light-emitting device according to (1) or (2) above, wherein a content of silver in the silver alloy is in a range from 90 to 99.99 atomic %.

(4) A positive electrode, for a compound-semiconductor light-emitting device according to any one of (1) to (3) above, wherein the film thickness of a reflective layer is in a range from 30 to 500 nm.

(5) A positive electrode, for a compound-semiconductor light-emitting device according to any one of (1) to (4) above, wherein the reflective layer has a contact metal layer in contact with a p-type semiconductor layer.

(6) A positive electrode, for a compound-semiconductor light-emitting device according to (5) above, wherein the contact metal layer contains at least one metal selected from the group consisting of Pt, Ir, Rh, Pd, Ru and Os or an alloy containing at least one of them.

(7) A positive electrode, for a compound-semiconductor light-emitting device according to (5) or (6) above, wherein a thickness of the contact metal layer is in a range from 1 to 30 nm.

(8) A compound-semiconductor light-emitting device having the positive electrode according to any one of (1) to (7) above.

(9) A compound-semiconductor light-emitting device according to (8) above, wherein the compound-semiconductor is a gallium nitride-based compound-semiconductor.

(10) A lamp comprising the compound-semiconductor light-emitting device according to (8) or (9) above.

According to the positive electrode for the compound-semiconductor light-emitting device of the present invention, it is possible to effectively restrict the electromigration of silver in comparison with the prior art reflective positive electrode using silver metal alone, since silver alloy is used in the reflective layer. As a result, the light-emitting device using the inventive positive electrode is high in inverse voltage and excellent in stability as well as productivity.

Also, silver alloy generally has a reflectance higher than pure silver metal, if suitable compositions are selected. Accordingly, the light-emitting device using the inventive positive electrode also facilitates the device output.

BEST MODES FOR CARRYING OUT THE INVENTION

Figure 1:
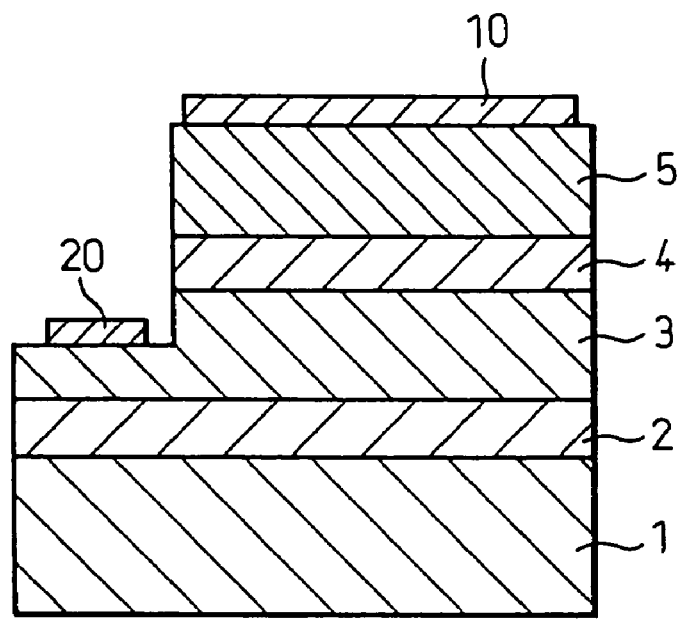
FIG. 1 is a schematic view showing general structure of a flip chip type compound semiconductor light-emitting device according to prior art.

As a compound-semiconductor light-emitting device using the inventive positive electrode, a structure, shown in FIG. 1 and wherein a buffer layer 2, an n-type semiconductor layer 3, a light-emitting layer 4 and a p-type semiconductor layer 5 are sequentially crystallized and grown on a substrate 1, and a negative electrode and a positive electrode are provided on the n-type semiconductor layer 3 and the p-type semiconductor layer 5 can be used without limitation.

In the present invention, the positive electrode comprises a reflective layer consisting of silver (Ag) alloy. The inventor of the present invention found that the electromigration of silver can be restricted by alloying silver. Although how the electromigration is restricted due to the alloying of silver is not yet clear, it is supposed on one hand that the aggregation of Ag is suppressed in an alloy film to result in a smoother surface. On the other hand, it is supposed that a metal alloyed with silver forms an oxide film (such as $Bi_2O_3$) on the surface. In view of such a supposition, the metal alloyed with silver is preferably that easily forming the oxide film. More concretely, Nd, Pd, Cu or Bi is particularly desirable as the metal alloyed with silver.

A ratio of Ag in the reflective layer is preferably at least 90 atomic %, more preferably at least 95 atomic %, most preferably at least 97 atomic %. If the percentage of Ag is too low, the reflectance largely lowers. On the contrary, if the percentage of Ag is too high, the restriction of the electromigration becomes unfavorable, whereby the ratio of Ag is preferably 99.99 atomic % or less, more preferably 99.9 atomic % or less, most preferably 99.5 atomic % or less.

Alloyed Ag has a better reflectance than pure Ag metal. This is also supposed to be because the aggregation of Ag is suppressed to smooth the surface. When a ratio of metal alloyed with silver is 1 to 2%, the reflectance becomes higher than pure Ag metal if the mating metal is suitably selected. On the contrary, the reflectance becomes lower if the alloyed ratio is high. The device output is also enhanced by the improvement in reflectance.

A film thickness of the reflective layer is preferably in a range from 30 to 500 nm. If the film thickness is too small, the reflectance becomes insufficient, and, on the contrary, if the film thickness is too large, the productivity is lowered. As a result, the film thickness is more preferably in a range from 50 to 300 nm, most preferably in a range from 60 to 250 nm.

While the positive electrode according to the present invention may be formed solely of a reflective layer consisting of Ag alloy, a contact metal layer having a low contact resistance and excellent in light-transmission property may be provided between the p-type semiconductor layer and the reflective layer. Also, a bonding pad layer is generally provided as the uppermost layer, for the electric connection with a circuit board or a lead frame.

When the reflective layer of Ag alloy is directly brought into contact with the p-type semiconductor layer, Ag in the alloy diffuses into the p-type semiconductor layer. The excessive diffusion of Ag into the p-type semiconductor layer causes the reduction of inverse voltage. It is supposed that this is because the crystallinity of the p-type semiconductor layer is deteriorated due to the diffusion of Ag. Accordingly, by providing the contact metal layer between the p-type semiconductor layer and the reflective layer, the contact metal layer operates also as means for preventing Ag from diffusing from the reflective layer to the p-type semiconductor layer, resulting in avoiding a reduction of inverse voltage.

As material for the contact metal layer, in order to achieve low contact resistance to the p-type semiconductor layer, it is preferable to use a metal having a high work function and, specifically, platinum group metals such as Pt, Ir, Rh, Pd, Ru and Os and alloys containing platinum group metals. Pt, Ir, Rh, and Ru are more preferable, and Pt is particularly preferable.

As the contact metal layer also has a role as a diffusion suppression layer for suppressing diffusion of Ag from the reflective layer to p-type semiconductor layer, it is preferable to use a metal of a dense structure and a high melting point. Specifically, a metal or an alloy with higher melting point than Ag is preferable. From this standpoint also, platinum group metals are preferable as materials for the contact metal layer.

In order to stably achieve low contact resistance, the thickness of the contact metal layer is preferably 1 nm or greater, more preferably 2 nm or greater, and most preferably 3 nm or greater. In order to obtain sufficient light-transmission property, thickness of the contact metal layer is preferably 30 nm or less, more preferably 20 nm or less, and most preferably 10 nm or less. As the contact metal layer also has a role as diffusion suppression layer to Ag and Al, thickness is preferably 0.5 nm or greater from this viewpoint, more preferably 1 nm or greater. Preferably, the contact metal layer is a continuous layer.

Various structures of the bonding pad layer have been well-known, using Au, Al, Ni, Cu or others. Any of materials and/or structures including the above-mentioned well-known ones may be usable for the present invention with no limitations. A thickness thereof is preferably in a range from 100 to 1000 nm. As the bondability becomes higher as the thickness of the bonding pad increases in view of the characteristic thereof, 300 nm or more is preferable. Further, in view of the production cost, the thickness is preferably 500 nm or less.

The reflective layer, the contact metal layer and the bonding pad layer may be formed by any of well-known method such as sputtering or vacuum deposition. Of them, the sputtering method is preferably used because a reflective layer excellent in reflectivity and a contact metal layer low in contact resistance are obtainable.

Preferably, a sputtering film forming method, using RF discharge, is used for forming the contact metal layer on the p-type semiconductor layer. By using a sputtering film forming method using RF discharge, an electrode with lower contact resistance can be obtained as compared to a vapor deposition method or a sputtering film forming method using DC discharge.

On the other hand, the reflective layer is preferably formed by a sputtering film forming method using DC discharge. The difference in the film obtained by the RF discharge sputtering method from that obtained by the DC discharge sputtering method resides in the crystallinity. The film obtained by the DC discharge sputtering method has a prismatic structure and is dense, while the film obtained by the RF discharge sputtering method has no prismatic structure and is coarse.

Accordingly, in the film formation by the RF discharge, there is an effect for reducing the contact resistance in an initial stage, but as the film thickness increases, the reflectance becomes inferior, because the film is coarse, to that obtained by the DC discharge. Therefore, it is preferable that the contact metal layer is formed initially by the RF discharge to be as thin as possible so that the light-transmission property is facilitated while maintaining the contact resistance at a low level, and then the reflective layer is formed thereon by the DC discharge.

Sputtering may be carried out using any known conventional sputtering apparatus under any suitably selected conditions conventionally known. A substrate having compound semiconductor layers laminated thereon is placed in the chamber, and temperature of the substrate is set in the range from room temperature to 500° C. Although heating of the substrate is not particularly required, the substrate may be suitably heated. The chamber is evacuated to the degree of vacuum in the range of $10^{-4}$~$10^{-7}$ Pa. He, Ne, Ar, Kr, Xe, etc. can be used as the sputtering gas. Ar is preferred in view of availability. One of these gases is introduced into the chamber up to the pressure of 0.1~10 Pa, and then, discharge is performed. Preferably the pressure is in the range of 0.2~5 Pa. Supplied electric power is preferably in the range of 0.2~2.0 kW. By suitably adjusting the discharge time and supplied power, the thickness of the formed layer can be adjusted. The content of oxygen in the required target used for sputtering is preferably 10,000 ppm or less in order to reduce the oxygen content of the formed layer, and is more preferably 6,000 ppm or less. When an alloy layer is formed through sputtering, in a preferred manner, an alloy having a target composition is prepared and formed into a sputtering target. The sputtering target having a target composition identical to that of the alloy layer is sputtered.

In the compound-semiconductor light-emitting device shown in FIG. 1, the substrate may be made of any of transparent materials including the known ones such as sapphire or SiC. Various compound-semiconductors of gallium nitride type have been known in the art, represented by the following general formula.

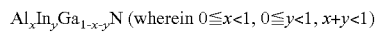

$Al_xIn_yGa_{1-x-y}N$ (wherein $0 \leq x < 1$, $0 \leq y < 1$, $x+y<1$)

Also, in the present invention, the above-mentioned gallium nitride type compound-semiconductors are usable without any limitations.

Figure 2:
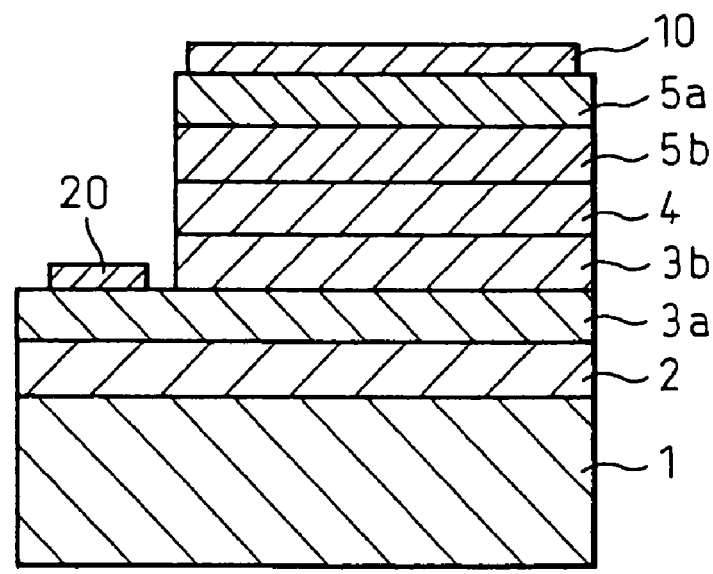
FIG. 2 is a schematic view showing an example of a flip chip type gallium nitride-based compound semiconductor light-emitting device according to the present invention.

As an example, as shown in FIG. 2, a gallium nitride-based semiconductor laminate having a buffer layer 2 consisting of AlN layer, a contact layer 3a consisting of n-type GaN layer, a lower clad layer 3b consisting of n-type GaN layer, a light-emitting layer 4 consisting of InGaN layer, an upper clad layer 5b consisting of p-type AlGaN layer, and a contact layer 5a consisting of p-type GaN layer successively laminated on a sapphire substrate 1 in this order, can be used.

A part of the contact layer 5a, the upper clad layer 5b, the light-emitting layer 4 and the lower clad layer 3b of gallium nitride-based compound semiconductor is removed by etching, and a negative electrode 20 of, for example, Ti/Au is provided on the contact layer 3a by a well-known method in the art, and a positive electrode 10 is provided on the contact layer 5a.

No particular limitation is imposed on the method for growing these gallium nitride semiconductors, and there may be employed any known method for growing a Group III nitride semiconductor, such as MOCVD (metal-organic chemical vapor deposition), HVPE (hydride vapor phase epitaxy), or MBE (molecular beam epitaxy). From the viewpoints of layer thickness controllability and mass productivity, MOCVD is preferably employed. In the case of MOCVD, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, monosilane ($SiH_4$) or disilane ($Si_2H_6$) serving as an Si source, or germane ($GeH_4$) or an organic germanium compound serving as a Ge source is employed as an n-type dopant, whereas bis(cyclopentadienyl)magnesium ($Cp_2Mg$) or bis(ethylcyclopentadienyl)magnesium (($EtCp)_2Mg$) serving as an Mg source is employed as a p-type dopant.

Through employment of the positive electrode of the present invention for a semiconductor light-emitting device, a gallium-nitride-based compound semiconductor light-emitting device exhibiting excellent characteristics and stability can be produced. In other words, a high-luminance LED can be produced on the basis of the technique. Thus, electronic devices such as mobile phones and display panels, each employing a chip fabricated on the basis of the technique; and machines and apparatuses such as automobiles, computers, and game machines, each employing any of the electronic device, can be driven at low electric power and realize excellent characteristics. Particularly, an electric power saving effect is remarkably attained in mobile phones, game machines, toys, and automotive parts, which are driven by a battery.

EXAMPLES

Present invention will now be described, in more detail below, with reference to Examples and Comparative example. It is to be understood that the present invention is by no means limited by these Examples.

Table 1 indicates the compositions of the reflective layers and the contact metal layers used in Examples and Comparative Examples, the initial characteristics of the devices and results of aging tests obtained therefrom. In this regard, the aging tests have been carried out, while using 10 samples in the respective Example, in an environment at 25° C. and 40 to 60% RH while continuously supplying a current of 30 mA for 100 hours, after which the number of samples resulting in the reduction of inverse voltage; i.e., the occurrence of electromigration; is counted. The driving voltage and the output power are initial values measured at a current of 20 mA.

Example 1

FIG. 2 is a schematic view showing a gallium nitride-based compound semiconductor light-emitting device fabricated in the present Example.

The gallium nitride-based compound semiconductor was formed by laminating a buffer layer 2 of AlN layer on a sapphire substrate 1, and by successively laminating thereon a contact layer 3a of n-type GaN layer, a lower clad layer 3b of n-type GaN layer, a light-emitting layer 4 of InGaN layer, an upper clad layer 5b of p-type AlGaN layer, a contact layer 5a of p-type GaN layer. The contact layer 3a is n-type GaN layer doped with Si at $7\times10^{18}/cm^3$, and lower clad layer 3b is n-type GaN layer doped with Si at $5\times10^{18}/cm^3$. The light-emitting layer 4 has single quantum well structure, and the composition of InGaN is $In_{0.95}Ga_{0.05}N$. The upper clad layer 5b is p-type AlGaN doped with Mg at $1>10^{18}/cm^3$, and the composition is $Al_{0.25}Ga_{0.75}N$. The contact layer 5a is p-type GaN layer doped with Mg at $5\times10^{19}/cm^3$. Lamination of these layers was carried out by MOCVD method under the usual conditions well known to those skilled in the art.

A flip chip type gallium nitride-based compound semiconductor light-emitting device was fabricated by providing a positive electrode 10 and negative electrode 20 to this gallium nitride-based compound semiconductor laminate following the procedure as described below.

(1) First, the contact layer 3a of the negative electrode forming region was exposed in the above-described gallium nitride-based compound semiconductor laminate. The procedure is as follows. Using known lithographic technology and lift-off technology, an etching mask was formed on the region other than the negative electrode forming region on the p-contact layer 5a.

Then, after etching was performed by reactive ion dry etching method until the n-contact layer 3a was exposed, the laminate was taken out from the etching apparatus, and the etching mask was removed by washing with acetone.

(2) Then, a positive electrode 10 was formed as follows. After the device was treated in boiling concentrated HCl for 10 minutes in order to remove an oxide film on the surface of the contact layer 5a, a positive electrode was formed on the contact layer 5a. First, a reflective layer was formed. The procedure for forming these layers is as follows.

A resist is coated uniformly, and known lithographic technique was used to remove the resist from a positive electrode forming region. After immersing the device in buffered hydrofluoric acid (BHF) at room temperature for one minute, a reflective layer was formed in a vacuum sputtering apparatus. Operating conditions for forming this layer by sputtering method are as follows.

The chamber was evacuated so that the degree of vacuum became lower than $10^{-4}$ PA. The above-mentioned gallium nitride type compound-semiconductor laminate was accommodated in the chamber. Ar gas was introduced in the chamber as a sputtering gas so that the interior pressure became 0.5 Pa, and the sputtering was carried out by the DC discharge to form a reflective layer. A supplied power was 0.5 kW, and the reflective layer was formed of Ag/Cu alloy.(Cu: 1 atomic %) of 200 nm thick. The composition of alloy in the reflective layer was controlled by preliminarily preparing a piece of alloy having this composition and using the same as a target.

Then, an 300 nm thick Au film was formed as a bonding pad layer by the sputtering of DC discharge at the same pressure and supply power as described above. After the sample was taken out from the sputtering apparatus, a portion of the metallic film other than the positive electrode was removed together with the resist by using the lift-off technique.

(3) A negative electrode 20 was formed on the contact layer 3a. The procedure for forming the negative electrode 20 is as follows. After a resist was coated uniformly all over the surface, on the region exposed up to contact layer 3a, known lithographic technique was used to open a window for negative electrode region, and vapor deposition method was used to deposit Ti and Au films in thickness of 100 nm and 300 nm, respectively. Metal films other than that on the negative electrode region were removed together with the resist.

(4) Then, a protective film was formed. The procedure is as follows. After a resist was coated uniformly all over the surface, known lithographic technique was used to open a window on a portion between the positive electrode and the negative electrode, and $SiO_2$ film was formed to a thickness of 200 nm by above-mentioned sputtering method. An $SiO_2$ film other than that on the protective film region was removed together with the resist.

(5) The wafer was cut into pieces, to thereby fabricate the gallium nitride-based compound semiconductor light-emitting device of the present invention.

The obtained gallium nitride type compound-semiconductor light-emitting device was mounted to TO-18 and the initial device characteristics were measured. Results thereof were shown in Table 1. Also, ten samples were mounted to TO-18 and aging tests were carried out to measure the change of inverse voltage before and after the respective test. Three in ten samples exhibited the reduction of inverse voltage which meant that electromigration occurred.

Examples 2 to 6

A gallium nitride type semiconductor light-emitting device was prepared in the same manner as in Example 1, except for changing a material for the reflective layer, and estimated in the same manner as in Example 1. The results thereof were indicated also in Table 1.

Example 7

A gallium nitride type semiconductor light-emitting device was prepared in the same manner as in Example 1, except that a 4 nm thick Pt contact metal layer was formed, and estimated in the same manner as in Example 1. Results thereof were indicated also in Table 1. As is apparent from Table 1, it was found that, by the provision of the contact metal layer, the driving voltage was largely reduced although the output power became slightly smaller, and the reduction of inverse voltage was also largely reduced in the aging test.

In this regard, the contact metal layer was formed by using Ar gas for the RF discharge sputtering at a pressure of 3 Pa and a supplied power of 0.5 kW.

Comparative Example

A gallium nitride type semiconductor light-emitting device was prepared in the same manner as in Example 1, except that the reflective layer is formed of Ag metal, and estimated in the same manner as in Example 1. Results thereof are indicated in Table 1. As is apparent from Table 1, it was found that the inverse voltage reduced in all the samples, showing that the generation of electromigration is more significant than in the present invention.

TABLE 1

| | Contact metal layer | Reflective layer | Generation of migration after 100 hr aging | Initial device characteristics | |
|---|---|---|---|---|---|
| | | | | Driving voltage (V) | Output power (mW) |
| comparative example | — | Ag | 10/10 | 3.5 | 6.5 |
| example 1 | — | Ag/Cu (1 atomic %) | 3/10 | 3.5 | 6.7 |
| example 2 | — | Ag/Cu (3 atomic %) | 3/10 | 3.5 | 6.4 |
| example 3 | — | Ag/Cu (10 atomic %) | 3/10 | 3.5 | 6 |
| example 4 | — | Ag/Nd (1 atomic %) | 2/10 | 3.5 | 6.3 |
| example 5 | — | Ag/pd (1 atomic %) | 2/10 | 3.5 | 6.4 |
| example 6 | — | Ag/Bi (1 atomic %) | 1/10 | 3.5 | 6.6 |
| example 7 | Pt | Ag/Cu (1 atomic %) | 1/10 | 3.2 | 6.1 |

INDUSTRIAL APPLICABILITY

The gallium nitride-based compound semiconductor light-emitting device provided by the present invention has excellent characteristics and stability, and is useful as a material for a light-emitting diode and lamp, etc.

The invention claimed is:

1. A positive electrode, for a compound-semiconductor light-emitting device having a structure wherein an n-type semiconductor layer, a light-emitting layer and a p-type semiconductor layer are sequentially crystallized and grown on a substrate, which comprises a reflective layer of silver alloy, wherein the silver alloy contains at least one element selected from the group consisting of neodymium, copper and bismuth, the reflective layer has a contact metal layer in contact with the p-type semiconductor layer, and the contact metal layer contains at least one metal selected from the group consisting of Ir, Rh, Ru and Os or an alloy containing at least one of them.

2. A positive electrode, for a compound-semiconductor light-emitting device according to claim 1, wherein a content of silver in the silver alloy is in a range from 90 to 99.99 atomic %.

3. A positive electrode, for a compound-semiconductor light-emitting device according to claim 1, wherein the film thickness of the reflective layer is in a range from 30 to 500 nm.

4. A positive electrode, for a compound-semiconductor light-emitting device according to claim 1, wherein a thickness of the contact metal layer is in a range from 1 to 30 nm.

5. A compound-semiconductor light-emitting device having the positive electrode according to claim 1.

6. A compound-semiconductor light-emitting device according to claim 5, wherein the compound-semiconductor is a gallium nitride-based compound-semiconductor.

7. A lamp comprising the compound-semiconductor light-emitting device according to claim 5.

* * * * *